United States Patent [19]
Freehauf

[11] Patent Number: 4,996,631
[45] Date of Patent: Feb. 26, 1991

[54] INJECTOR/EJECTOR SYSTEM FOR RACK MOUNTED PLUG-IN MODULES WITH FRONT PANELS

[75] Inventor: Eugene G. Freehauf, Ontario, Calif.

[73] Assignee: Canoga Industries, Inc., San Diego, Calif.

[21] Appl. No.: 428,860

[22] Filed: Oct. 30, 1989

[51] Int. Cl.[5] .............................................. H05K 7/14
[52] U.S. Cl. ..................................... 361/415; 211/41; 361/391
[58] Field of Search ................. 211/41; 361/391–392, 361/394–395, 399, 412, 413, 415

[56] References Cited

U.S. PATENT DOCUMENTS

| | | |
|---|---|---|
| 2,993,187 | 7/1961 | Bisbing et al. |
| 3,451,034 | 6/1969 | Beae |
| 3,772,572 | 11/1973 | Marquette |
| 3,944,311 | 3/1976 | Sprenkle et al. |
| 4,064,551 | 12/1977 | Lightfoot |
| 4,301,494 | 11/1981 | Jordan |
| 4,313,150 | 1/1982 | Chu ............................ 361/399 |
| 4,472,763 | 9/1984 | Loris |
| 4,564,250 | 1/1986 | Klein et al. |
| 4,603,375 | 7/1986 | Miller et al. |
| 4,632,588 | 12/1986 | Fitzpatrick |
| 4,648,009 | 3/1987 | Beun et al. ................. 361/395 |
| 4,702,535 | 10/1987 | Beun |
| 4,725,921 | 2/1988 | Scholz |
| 4,902,239 | 2/1990 | Schindler et al. |

FOREIGN PATENT DOCUMENTS

| | | |
|---|---|---|
| 1037240 | 8/1978 | Canada |
| 2812631 | 10/1978 | Fed. Rep. of Germany |
| 2823422 | 12/1978 | Fed. Rep. of Germany |
| 2382147 | of 0000 | France |
| 609220 | 5/1978 | U.S.S.R. |
| 2015828 | 9/1979 | United Kingdom ........... 361/391 |
| 2188196 | 9/1987 | United Kingdom |

OTHER PUBLICATIONS

Advertisement brochure by Scanbe for E-Z-Ject and S-217.
Advertisement brochure for Scanbe for E-Z-Ject dated Feb. 1986.
Catalogue by Scanbe for circuit cards etc.

Primary Examiner—Gregory D. Thompson
Attorney, Agent, or Firm—Knobbe, Martens Olson & Bear

[57] ABSTRACT

A circuit board ejector/injector system enabling the insertion and removal of circuit boards from a card cage is provided. A lever handle is rotatably mounted on an exterior corner of the circuit board in a manner that permits the lever handle to extend out and through an opening formed in an outer front panel of the card cage. Insertion and removal of the circuit boards is accomplished by the selective rotation of the lever handle, with only one of a pair of finger extensions located on the lever arm cooperatively inter-engaging with the circuit board, depending upon the direction of lever handle rotation. Reversal of the rotational direction causes the other finger extension to inter-engage with the circuit board, and the removal/insertion process to be reversed.

21 Claims, 4 Drawing Sheets

INJECTOR/EJECTOR SYSTEM FOR RACK MOUNTED PLUG-IN MODULES WITH FRONT PANELS

BACKGROUND

1. Field of the Invention

This invention relates to circuit board ejector/injector systems and more particularly to those systems for use with a printed circuit board plug-in unit having an integral front panel, with a desired unit being insertable and removable from a card cage and with an injector/ejector mounted on the circuit board to facilitate the insertion and removal of the unit from the card cage.

2. The Prior Art

In the electronics industry, electronic components are often interconnected for mass manufacturing purposes by mounting them on printed circuit boards. The printed circuit boards are connected to other electrical devices by means of electrical connectors carried by the printed circuit boards. Groups of printed circuit boards are often interconnected by placing them in circuit board subracks, also known as card cages, that include mounting hardware for the printed circuit boards. The card cages include a pair of spaced card guides for slidably receiving the opposite edges of a printed circuit board. The card cages are interconnected with the printed circuit board by means of an electrical connector aligned with the electrical connector or connectors carried by the printed circuit board and to be placed in an electrically conductive circuit relationship therewith. In this arrangement, it is common for the end of the printed circuit board opposite to the end mounting the electrical connector to be secured in a perpendicular, integrated relationship with the panel member. This integral unit is referred to as a plug-in unit or plug-in module in the art.

The gripping action provided by the two interconnected electrical connectors: namely, the connector or connectors carried by the printed circuit board and the electrical connector associated with the subrack or card cage, make it difficult to remove the printed circuit board plug-in unit from the electrical connector of the card cage system. Typically, two handles are mounted on the front panel of the plug-in unit to permit the plug-in unit to be manually pulled from the card cage connectors. However, this is often not an easy task. Accordingly, ejectors have also been mounted on the front panel of some types of plug-in unit boards as an aid in extracting the printed circuit board plug-in unit from the electrical connector of the card cage or subrack. In this subrack or card cage, a common surface is conventionally provided adjacent the front panel of the plug-in unit to function as a fixed ejection surface for any ejector mounted to the front panel member.

A typical prior art ejector facilitates the removal of the plug-in unit by using a pivoting lever arm to bear against the fixed ejection surface and reduce the force necessary to be applied by the user. Existing ejectors typically consist of several components which must be assembled and attached to the card cage or, in some cases, to the printed circuit board. There are typically two ejectors on each printed circuit board plug-in unit, one adjacent each end of the front panel, to permit ejection of the unit without skewing or twisting of the board. One such ejector is disclosed in U.S. Pat. No. 4,603,375 to Miller, et al. which patent is hereby incorporated herein by reference.

Some ejector systems have been developed in which the ejector lever is also capable of injector operation. One type of system for accomplishing both injection and ejection involves use of a member which is pivotally mounted on the circuit board, and which includes a single finger that extends into a receiver such as a notch in the adjacent frame of the card cage. This type of configuration typically creates excessive fatigue problems on that single finger, since that single component is stressed in one direction upon insertion, and in the other direction upon ejection.

Another configuration for accomplishing both injection and ejection using the same pivotal device comprises a device which is pivotally mounted on a circuit board, and which has a receiver or notch located adjacent the card cage frame. The card cage frame includes a single member such as a panel edge that fits within the receiver or notch to provide the bearing surfaces. Again, fatigue problems are increased in this type of configuration, since a single member provides the bearing surfaces used for both insertion and ejection. Furthermore, operation of the injection/ejection systems described above involves an inherent problem of inserting the single finger within the receiver in the first mentioned embodiment, or inserting the notch around the single bearing surface in the second mentioned embodiment, during insertion of the plug-in unit. This requires proper alignment of the insertion/ejection handle or use of additional components to accomplish the alignment during the insertion process. In addition to these problems, the above-described injection/ejection systems could not be used in conjunction with present VXI printed circuit board plug-in unit technology, a new industry standard for the configuration of card cages, as required by present standard specifications, dictates use of an insertion bearing surface that is provided by an insertion member positioned on the frame of the card cage at a location which is separate and removed from the ejection bearing surface.

It would, therefore, be a substantial improvement in the technology to provide an injector/ejector system adapted for use with VXI (and other) printed circuit board plug-in unit technology, and which avoids the difficulties of existing systems such as excess fatigue on the injector/ejector members, and difficulties of insertion/ejection system component alignment during insertion of the plug-in unit. It would be a further improvement in the technology to provide such a system which would involve use of a minimum number of components, without compromising system structural strength and integrity. Such an invention is described and claimed herein.

SUMMARY OF THE INVENTION

The present invention comprises an improved injector/ejector system in which the number of necessary components are reduced and the injecting and ejecting operations are effectuated by separately spaced components of a unitary device, thereby increasing the durability of the system and providing easier system operability. Further, the injector/ejector system may be utilized on any currently specified VXI printed circuit board plug-in unit.

In one preferred embodiment the present invention comprises an injector/ejector defining a unitary construction of a lever arm and two finger extensions oppositely situated and effectively spaced from one another, and which are attached to the circuit board at a location proximate to an exterior corner of the circuit board. A bushing is positioned within and extends through an aperture formed in the injector/ejector, with the length of the bushing slightly exceeding the width of the injector/ejector. A pivot pin such as a screw or bolt extends through the bushing, through an aperture in the circuit board and through an aperture in a mounting block positioned on the other side of the circuit board. A nut is secured to the end of the pivot pin. In the preferred embodiment, the injector/ejector is secured adjacent to the back face of the printed circuit board, opposite the side upon which the electrical components are affixed.

Preferably manufactured integrally with each other, the lever arm and finger extensions rotate parallel and adjacent to the plane of the circuit board face. The system is operated by manually moving the lever handle toward or away from the circuit board face, thereby simultaneously bringing one of the finger extensions into contact with a corresponding bearing surface. A second identical system may be symmetrically attached proximate to the opposite exterior corner of the circuit board.

Both the lever handle and the finger extension that controls the ejection operation extend outwardly through an opening in a front panel that is orthogonally secured by means of a mounting bracket so as to lie adjacent to the exterior vertical edge of the circuit board. The user may thus grasp the lever handle without removing the front panel in order to operate the ejector/injector system. The finger extension that controls the injection operation remains on the interior side of the front panel, its exposure to the outside being unnecessary for effective operation.

When the system is operated, the lever handle and the two finger extensions rotate about the pivot pin in the same direction. When the printed circuit board plug-in unit is ready for insertion into a card cage, the lever handle is not adjacent the front panel, and can be at its most removed position from the front panel, signifying an open injection finger extension position and a closed ejection finger position. As the card is inserted into the respective slot in the card cage and urged inward, the lever handle may be rotated toward the front panel so that the insertion finger may engage a rigid internal bearing surface located on the adjacent frame of the card cage. The internal bearing surface, for example, may be effectuated by providing a protruding ridge on the interior face of the card cage frame. Because the moment arm of the injection finger is significantly smaller than the moment arm of the lever handle, the applied force required by the user on the lever to interconnect the electrical connectors is minimized. When the lever handle is positioned adjacent the face panel, the printed circuit board plug-in unit is effectively secured to the card cage for operation by the user.

When the user desires to remove the printed circuit board plug-in unit from the card cage, the lever handle is pulled away from the front panel so as to disengage the insertion finger from the fixed interior bearing surface and to subsequently engage the ejection finger extension with a mounting bar that is also integral with the frame of the card cage. As the lever handle is further rotated away from the face panel, the force of the ejection finger extension against the mounting bar drives the printed circuit board plug-in unit outward, thus effecting an ejection of the plug-in unit with minimum user force. With the plug-in unit totally extracted, the lever is returned to its initial position and the plug-in unit is ready for reinsertion at a later date.

The invention will be better understood with reference to the following description and appended claims taken in conjunction with the accompanying drawings.

DETAILED DESCRIPTION OF THE PREFERRED EMBODIMENT

Reference is now made to the drawings wherein like parts are designated with like numerals throughout.

Figures 1, 2:
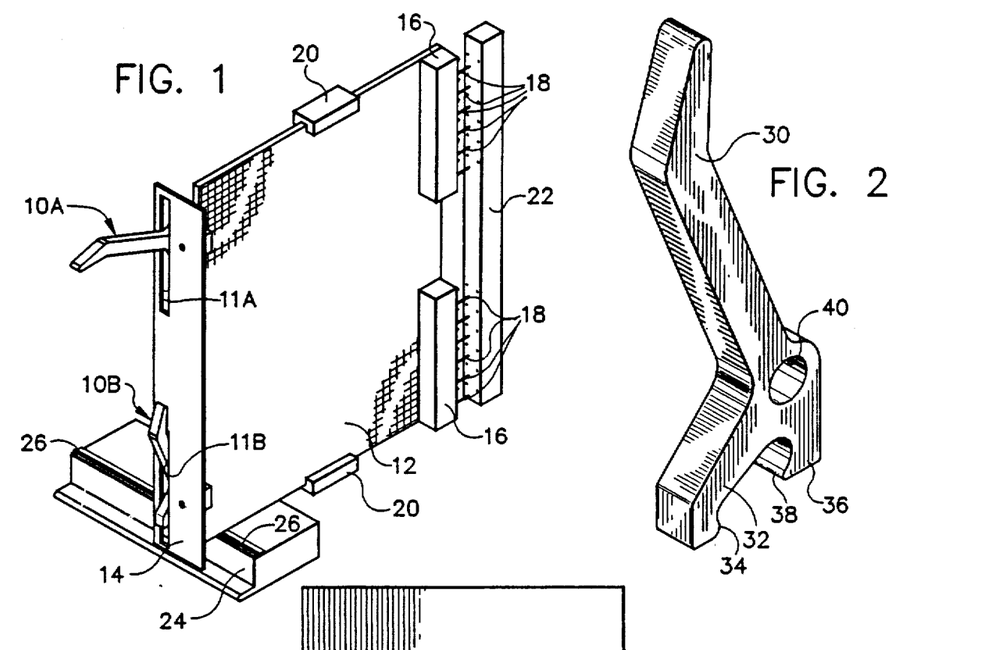
FIG. 1 is a perspective illustration of one presently preferred embodiment of the apparatus of the present invention, as employed in connection with a printed circuit board plug-in unit that includes a front panel.
FIG. 2 is a perspective illustration of one presently preferred embodiment of the injector/ejector of the present invention.

Referring initially to FIG. 1, one preferred embodiment of the injector/ejector system of the present invention is illustrated. In particular, FIG. 1 illustrates a pair of injector/ejectors 10A and 10B as components of a system including a printed circuit board plug-in unit 12 having a front panel 14 secured to one end of the plug-in unit 12 in an orthogonal relationship therewith. Two longitudinally-slotted openings 11A and 11B are provided in the front panel 14 to permit the pivotal movement of injector/ejectors 10A and 1-B as discussed further below. While the present invention contemplates an embodiment with one injector/ejector as well as an embodiment with two injector/ejectors, FIG. 1 illustrates the preferred embodiment having two injector/ejectors. It is to be understood that the two injector/ejectors 10A and 10B are identical in configuration and operation except that they are secured in opposing directions. As a result, a detailed description of the injector/ejector 10B, a part of which extends through opening 11B, will be sufficient to appreciate both injector/ejectors.

The plug-in unit 12 carries an electrical connector 16 having male pins 18 extending outwardly therefrom, two such electrical connectors 16 are illustrated in FIG. 1 that are arranged adjacent opposite corners of the plug-in unit 12 and adjacent the inner edge thereof. A subrack or card cage is generally defined by a pair of spaced card guides 20 (partially illustrated) of conventional construction. The card guides 20 are provided with a longitudinal slot to slidably receive and guide the opposite edges of the plug-in unit 12 in its travel toward the end of the card cage. The subrack or card cage includes an electrical connector 22 that is mounted in a spaced relationship with the card guides 20 and fixed in position between the ends of the guides so as to receive the male pins 18 of the connectors 16 in electrical circuit relationship. The card cage connector 22 is suitably supported (not shown) in a fixed position and may have female receptacles for receiving the pins 18.

The configuration of the subrack or card cage includes a common ejecting surface for the card cage, that functions as an ejection bearing surface 24 for extracting the electrical connectors 16 from the electrical connector 22. The connectors 16 and 22 are illustrated in an extracted relationship in FIG. 1. The ejecting bearing surface 24 is arranged immediately behind or flush with the front panel 14 on the plug-in unit when the two electrical connectors 16 and 22 are interconnected and on the same side of the front panel member 14 as the plug-in unit 12.

Usually, a pair of handles (not shown) are attached to the front panel 14 to permit the plug-in unit to be manually pulled from the connector 22. It has been found that due to the gripping action between the connectors 16 and 22, it is difficult to remove a plug-in unit from the electrical connector 22. To aid in the insertion and the extraction of the connectors 16 and 22, one or more injector/ejectors have been provided such as the injector/ejectors 10A and 10B that are mounted to the front panel member 14 of the plug-in unit. As illustrated in FIG. 1, a pair of injector/ejectors 10A and 10B may be mounted adjacent the opposite ends of the front panel member 14. Also, an ejection bearing surface 24 is provided on the frame of the card cage, located adjacent to and behind front panel member 14 at the top and bottom thereof for the purposes of providing a desired ejecting action at both injector/ejectors 10A and 10B. Likewise, an injection bearing surface 26 is also provided on an inner surface of the frame of the card cage, adjacent to the forward end of the plug-in unit 12; similarly at both top and bottom. Both the ejection bearing surface 24 and the injection bearing surface 26 will be described in more detail hereafter.

Only one of the ejection bearing surfaces 24 is illustrated in FIG. 1, it being recognized that the second ejection bearing surface would be spaced adjacent the topmost injector/ejector 10A as illustrated in FIG. 1. The bottom injector/ejector 10B of FIG. 1 functions in response to a pivoting force applied thereto and which force would be applied by rotating the injector/ejector 10B away from the panel 14. As this rotation continues, the injector/ejector 10B achieves a configuration that is the mirror image of the illustrated configuration of injector/ejector 10A. The downwardly directed pivoting force applied by the user to the injector/ejector 10B is transmitted to the ejecting bearing surface 24 to cause the plug-in unit to be moved outwardly from the electrical connector 22 in response thereto. A similar action occurs when an upwardly directed pivoting force is applied to pull the top injector/ejector 10A from an inserted position toward the illustrated position of that injector/ejector 10A. Since injector/ejectors 10A and 10B operate in a substantially identical manner, but in reverse directions, the structure and operation of the system associated with injector/ejector 10B will be described. It will be understood that such a discussion, with rotation directions reversed, would define the structure and operation of injector/ejector 10A.

The physical configuration of the injector/ejector 10A, 10B can be more fully understood by reference to FIG. 2. In particular, one preferred embodiment of the injector/ejector of the present invention comprises device of unitary construction, including a lever handle 30 which, preferably, is angular in configuration so that it will lie in adjacent, low profile, orientation with respect to the front panel 14, as illustrated at 10B in FIG. 1. Extending from the base portion of lever handle 30 in a generally downward and outward direction is an ejection finger 32. The forward end of ejection finger 32 defines an enlarged area forming an ejection surface 34. The ejection surface 34 is configured to contact and communicate ejection forces from the plug-in unit through the ejection finger 32 and ejection surface 34 to the ejection bearing surface 24 of FIG. 1, in a manner to be described more fully hereafter.

Also extending from the base of lever handle 30 in a downwardly direction spaced from ejection finger 32 is an ejection finger 36. The lower rearward portion of ejection finger 36 is configured to define a ridge that extends generally in the direction of the ejection surface 34, and forms an injecting surface 38. The injection bearing surface 38 is configured to contact injection bearing surface 26 of FIG. 1, and to communicate forces from the lever handle 30 through the injection finger 36 and injecting surface 38 to the injection bearing surface 26 during injection of the plug-in unit 12 into the card cage, in a manner to be described more fully hereafter.

Positioned substantially intermediate between the lever handle 30 and the ejection and injection fingers 32 and 36, respectively, is a pivot aperture 40. Pivot aperture 40 extends through the body of the injector/ejector 10B to define an axis of rotation about which the injector/ejector can pivot during normal operation.

In order to achieve sufficient structural strength for operation under the forces present in the specified configuration of the VXI technology, the injector/ejector 10B is preferably constructed of material such as aluminum. The construction process may be accomplished by any normal metal working means, such as machining of the piece from a block of raw material or, more preferably, a metal extrusion process. Of course, other materials could be used to form the injector/ejector 10B so long as the resulting product could withstand the forces generated during insertion and ejection of the plug-in unit 12 within the card cage.

Figure 3:
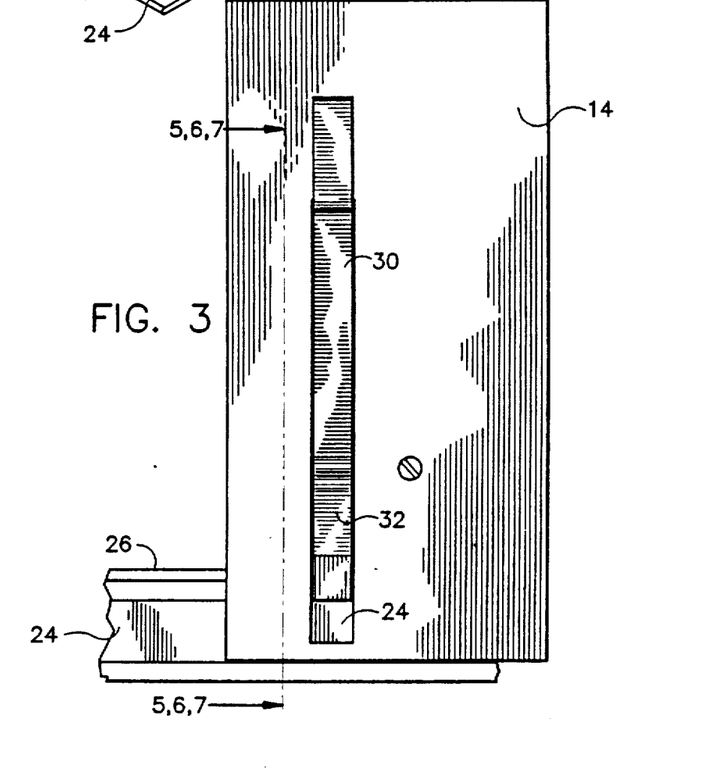
FIG. 3 is a front elevational view of the lower portion of the injector/ejector system illustrated in FIG. 1.

FIG. 3 illustrates the relationship between the front panel member 14 and the injector/ejector 10B, when in the configuration illustrated at 10B in FIG. 1. In particular, the relationship between the ejecting surface 34 and the ejection bearing surface 24 upon which ejecting surface 34 interacts can be more fully appreciated.

Figure 4:
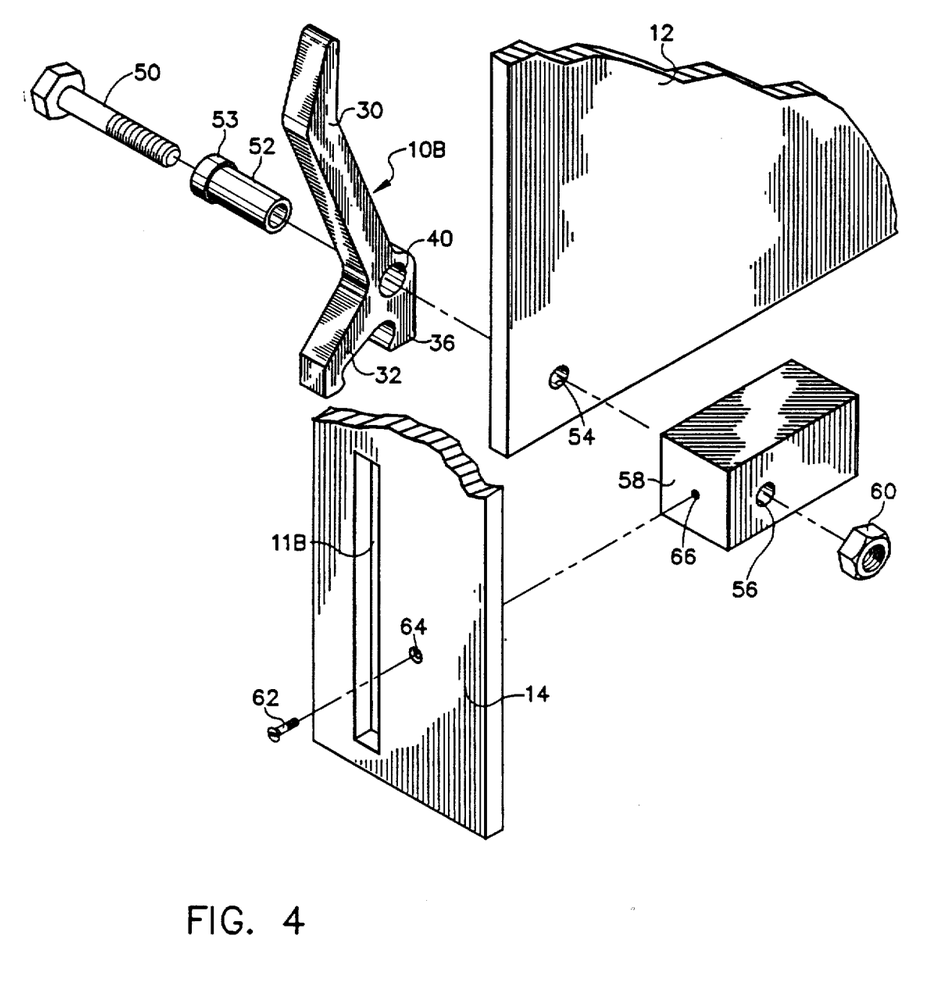
FIG. 4 is an exploded perspective view of one presently preferred embodiment of the injector/ejector system of the present invention, illustrating the means by which components of the system are secured in assembled configuration.

Referring now to FIG. 4, the interrelationship between the components of the injection/ejection system that are mounted upon the circuit board 12 may be described. In particular, a pivot pin 50 comprising a bolt or screw, for example, passes through the bore of a bushing 52 having a raised portion or shoulder 53 which, after assembly, abuts the rear surface of the head of pivot pin 50. The bushing 52 extends within the pivot aperture 40 of the injector/ejector 10B. It is noted that the external diameter of the bushing 52 is less than the interior diameter of the pivot aperture 40, so that the injector/ejector 10B is permitted to rotate about the axis defined by pivot pin 50 extending through pivot aperture 40. The bushing 52 is slightly longer than the width of the injector/ejector 10B so that when assembly is complete, the injector/ejector 10B, sandwiched between the head of pivot pin 50 and the surface of circuit board 12 is separated therefrom sufficiently to permit pivotal rotation of that injector/ejector. The shoulder 53 prevents the injector/ejector 10B from sliding off of the bushing 52 and contacting the head of pivot pin 50.

The forward end of pivot pin 50 extends beyond the end of the bore in the bushing 52, and passes through an aperture 54 in the circuit board 12. The forward end of pivot pin 50 then passes through an aperture 56 in a mounting block 58, which is positioned on the side of the plug-in unit 12 opposite to the side which is adjacent to injector/ejector 10B. A nut 60 or similar retaining device, is secured to the forward end of pivot pin 50, and is tightened by the amount necessary to retain the injector/ejector 10B, and the mounting block 58 adjacent the surface of the plug-in unit 12. It is noted that the mounted block 58 is preferably positioned on the side of the plug-in unit upon which the electronic components are positioned, while the injector/ejector 10B is secured adjacent the other or "back" side of the plug-in unit 12.

The front panel 14 is secured against the forward edge of the plug-in unit 12 by means of a screw 62 which passes through a counter-sunk aperture 64 in the front panel 14 and extends into an aperture 66 in the forward face of the mounting block 58. When assembled in this manner, the lever handle 30 and ejection finger 32 extend through the elongated aperture 11 in the front panel 14, in the manner illustrated in FIG. 1. This configuration requires a minimum of components, while permitting injection and ejection of the plug-in unit 12 through use of single, unitary injector/ejector 10B.

Figures 5, 6, 7:
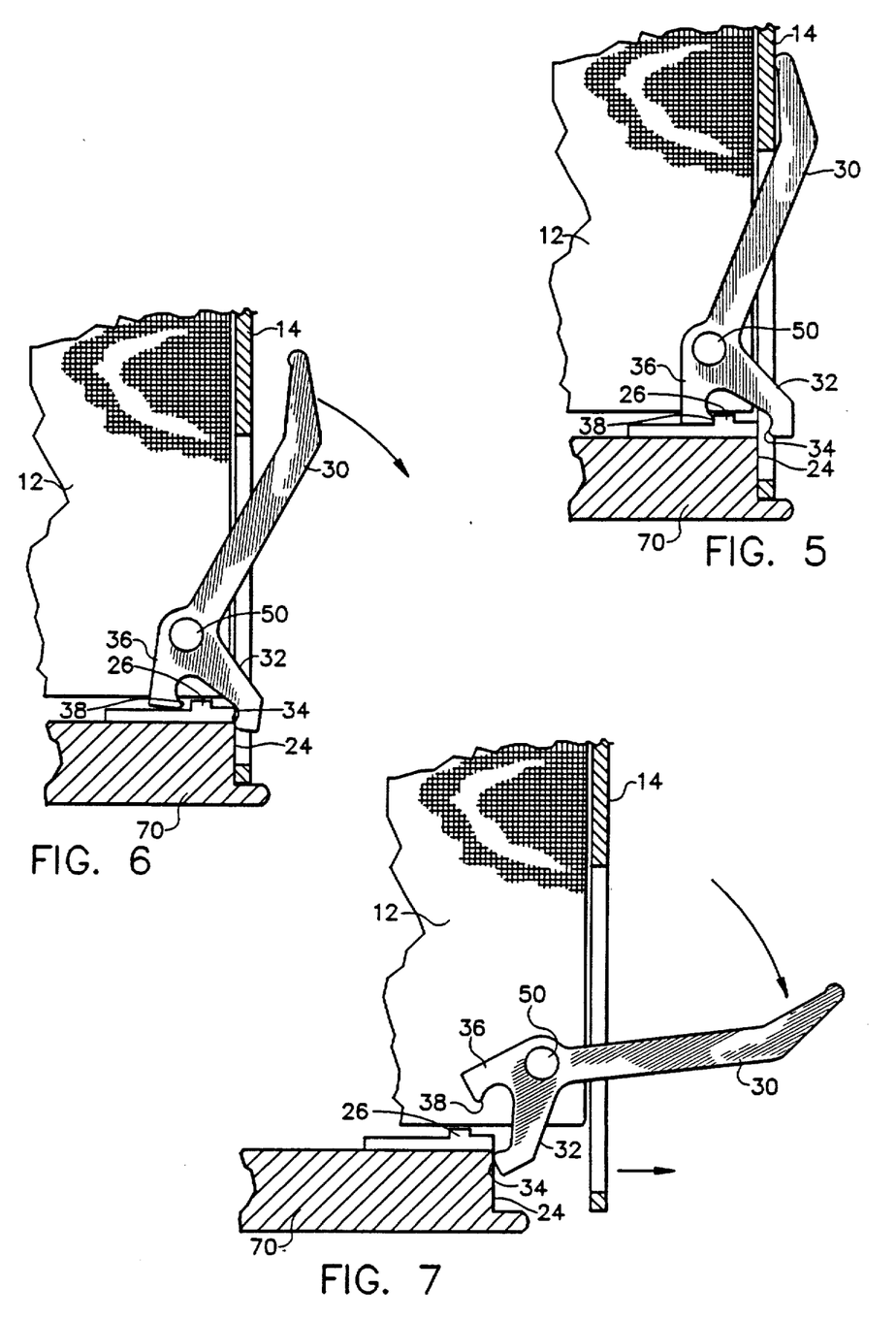
FIG. 5 is a side elevational view of one presently preferred embodiment of the injector/ejector system, taken along lines 5—5 of FIG. 3, illustrating the associated circuit board unit in an inserted position.
FIG. 6 is a side elevational view of the injector/ejector system taken along lines 6—6 of FIG. 3, and illustrating the system in a ready to eject position.
FIG. 7 is a side elevational view of the injector/ejector system taken along lines 7—7 of FIG. 3, and illustrating the system with the associated printed circuit board plug-in unit in a partially ejected configuration.

Operation of the injector/ejector system of the present invention can best be understood by reference to FIGS. 5-7. Referring initially to FIG. 5, the injector/ejector system is illustrated with the plug-in unit 12 in the fully inserted position.

When the user desires to remove the plug-in unit 12 from the card cage, the lever handle 30 is pulled outwardly away from the front panel 14 and rotated in a downwardly direction disengaging injecting surface 38 from contact with the injection bearing surface 26 of a raised ridge that is positioned the inner frame wall of the card cage. Simultaneously the ejection finger 32 is rotated towards the ejection bearing surface 24 on a mounting bar 70 in the card cage frame. The mounting bar 70 is integral with the base of the card cage and acts secondarily as a bearing surface for the ejection finger 32. In the interval during which the injector/ejector 10B is rotated between the fully injected position, as shown in FIG. 5, and the ready ejection position, as shown in FIG. 6, the plug-in unit 12 remains stationary and the connectors 16 and 22 (FIG. 1) remain interconnected. After the ejecting surface 34 of the ejection finger 32 initially engages the the injection bearing surface 24 of mounting bar 70, the lever handle 30 may be further rotated downwardly, permitting the plug-in unit 12 to be leveraged away from the card cage connectors 22. When the ejection finger 32 is fully engaged, the force applied by the user on the lever handle 30 is transferred to the pivot pin 50 and acts to pull the plug-in unit 12 in an outward direction simultaneously overcoming the grip of the electrical connectors 22. When the lever handle 30 has been rotated to its furthest downward position, as best illustrated in FIG. 7, the circuit board 12 may be fully removed with negligible effort. The system is thus in ready position for insertion of the plug-in unit into the card cage at a later time period.

When the user intends to insert the plug-in unit into the card cage, the plug-in unit is partially inserted to a position such as that illustrated in FIG. 7. The user then grasps the lever handle 30 and urges the handle upward and rotates it towards the front panel 14 thereby engaging the injecting surface 38 of the injection finger 36 with the injection bearing surface 26 on the raised ridge. Further rotation of the lever handle in an upward direction drives the circuit board module continuously inward into an interconnecting and operating position within the card cage. When the circuit board module is fully inserted, the lever handle 30 is in its vertical most position and the ejection finger 32 is in its most outwardly extended position, as shown in FIG. 5.

Figure 8:
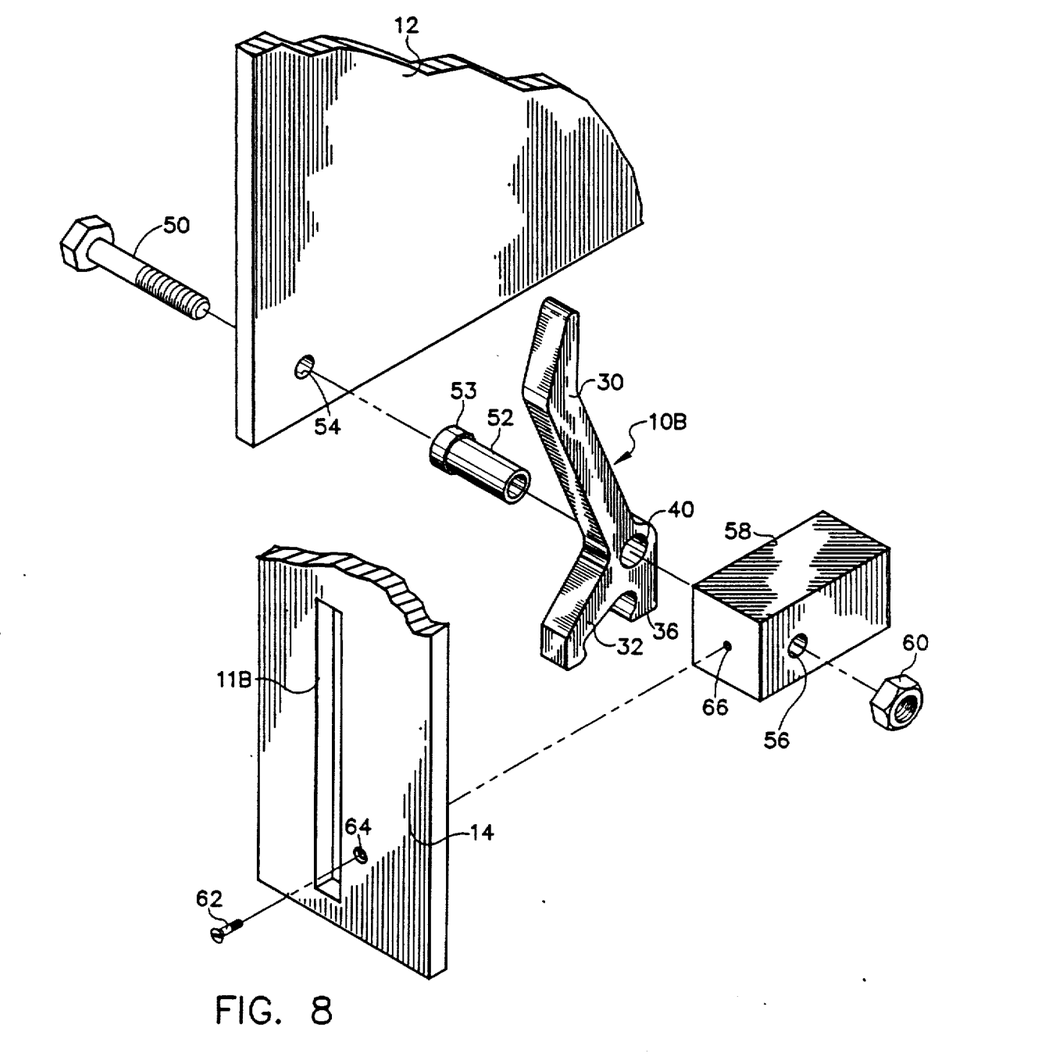
FIG. 8 is an exploded perspective view, similar to FIG. 4, showing an alternate embodiment of the injector/ejector system of the present invention.

Another embodiment of the present invention is illustrated in FIG. 8, where it may be seen that the injector/ejector 10B is positioned in between the plug-in unit 12 and the mounting block 58. In comparison, FIG. 4, as discussed above, illustrates the injector/ejector 10B as being positioned adjacent the plug-in unit 12 opposite to the mounting block 58 rather than in between as discussed below. However, the essential operation of the embodiment of FIG. 8 is the same as the embodiment illustrated in FIG. 4.

Referring now to FIG. 8, the pivot pin 50 passes through the aperture 54 in the plug-in unit 12 and through the bushing 52 which is positioned on the opposite side of the plug-in unit from the pivot pin 50. The raised portion or shoulder 53 abuts a face of plug-in unit 12 so that the plug-in unit 12 is sandwiched between the head of pivot pin 50 and the shoulder 53 of bushing 52. The bushing 52 extends within the pivot aperture 40 of the injector/ejector 10B. It is noted that the external diameter of the bushing 52 is less than the interior diameter of the pivot aperture 40, so that the injector/ejector 10B is permitted to rotate about the axis defined by pivot pin 50 extending through pivot aperture 40. The bushing 52 is slightly longer than the width of the injector/ejector 10B so that when assembly is complete, the injector/ejector 10B, sandwiched between the shoulder 53 of bushing 52 and the mounting block 58, is separated therefrom sufficiently to permit pivotal rotation of that injector/ejector.

The forward end of pivot pin 50 extends beyond the end of the bore in the bushing 52, and passes through the aperture 56 in the mounting block 58, which is positioned adjacent to injector/ejector 10B. A nut 60 or similar retaining device, is secured to the forward end of pivot pin 50, and is tightened by the amount necessary to retain the injector/ejector 10B and the mounting block 58 to the surface of the plug-in unit 12.

The front panel 14 is secured against the forward edge of the plug-in unit 12 by means of a screw 62 which passes through a counter-sunk aperture 64 in the front panel 14 and extends into an aperture 66 in the forward face of the mounting block 58. When assembled in this manner, the lever handle 30 and ejection finger 32 extend through the elongated aperture 11B in the front panel 14, in the manner illustrated in FIG. 1. This configuration requires a minimum of components, while permitting injection and ejection of the plug-in unit 12 through use of a single, unitary injector/ejector 10B.

With the fingers 32 and 36 configured with respect to each other in the manner illustrated, and with the lever handle 30 being distant from the fingers 32 and 36, and with the pivot pin 50 interposed between the fingers 32 and 36 and the lever handle 30, it is possible to provide a unitary injector/ejector device which includes separate injecting and ejecting members and bearing surfaces. Such a configuration minimizes component fatigue, while defining such a unitary device that can accomplish both injection and ejection of the plug-in unit 12 into the card cage, without the requirement for separate injection and ejection devices, and without the excessive use of space on the plug-in unit 12.

Accordingly, the present invention comprises an injector/ejector system that uses a single, unitary constructed injector/ejector device, thereby overcoming many longstanding difficulties in the technology, by providing an injector/ejector system which is adapted for use in various circuit board mounting systems including use with VXI printed circuit board plug-in unit technology; by providing such an injector/ejector system that minimizes the fatigue on the members of the injector/ejector system; and by providing such a system that avoids the component alignment difficulties experienced during operation of prior injector/ejector systems that have attempted use of a single operational lever.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A unit for injecting and ejecting a plug-in unit within a card cage having an ejection bearing surface and an injection member separate from the ejection bearing surface, said injection member having an injection bearing surface, the injecting/ejecting unit comprising:
    a handle portion adapted for operating the injecting/ejecting unit;
    a pivot portion having an upper outward portion that is integrally connected to a lower inward portion of the handle portion, said pivot portion defining a configuration permitting interconnection of the pivot portion to the plug-in unit, and permitting pivotal movement of the handle portion about said interconnection to the plug-in unit;
    an ejection finger extending from said lower outward portion of the pivot portion and integrally connected thereto, said ejection finger defining an ejecting surface on an inward end thereof for contacting the ejection bearing surface of the card cage during extraction of the plug-in unit from the card cage; and
    an injection finger extending from said lower inward portion of the pivot portion that is separate from the lower outward portion of the pivot portion, and integrally connected to said lower outward portion, said injection finger defining an injecting surface on a lower end thereof for contacting the injection bearing surface of the card cage during insertion of the plug-in unit into the card cage, such that when said injecting/ejecting unit is used with the plug-in unit, said injecting/ejecting unit is positioned entirely adjacent a side of the plug-in unit that is opposite to a side upon which electronic components are secured.

2. A unit as defined in claim 1, further comprising a pivot pin extending through an aperture in the pivot portion, said pivot pin extendable through an aperture in the plug-in unit so as to secure the pivot portion adjacent to the plug-in unit when the injecting/ejecting unit is used with the plug-in unit and a bushing positioned within the aperture in the pivot portion and extending longitudinally beyond the boundaries of said aperture in the pivot portion, and said bushing surrounding a portion of the pivot pin within the aperture of the pivot portion so as to separate the pivot portion from contact with the plug-in unit when the injecting/ejecting unit is used with the plug-in unit and to permit pivotal rotation of the injecting/ejecting unit about the pivot pin.

3. A unit as defined in claim 2, further comprising a raised shoulder located on a portion of the bushing distant from the plug-in unit when the injecting/ejecting unit is used with the plug-in unit so as to prevent the injecting/ejecting unit from sliding off the bushing.

4. A unit as defined in claim 1, further comprising:
    a mounting block securable to a surface of the plug-in unit that is opposite to the surface which is adjacent the injecting/ejecting unit when the injecting/ejecting unit is used with the plug-in unit; and
    a pivot pin extendable through apertures in the injecting/ejecting unit, said mounting block and the plug-in unit so as to secure said injecting/ejecting unit, said mounting block and the plug-in unit in adjacent configuration when the injecting/ejecting unit is used with the plug-in unit.

5. A unit as defined in claim 4, wherein the plug-in unit, which securably accepts said injecting/ejecting unit, includes a front panel adapted to be secured adjacent and in orthogonal relationship to a front end of the plug-in unit, said injecting/ejecting unit further comprising:
    means for connecting the front panel to the mounting block to secure the front panel in the orthogonal relationship to the plug-in unit when said injecting/ejecting unit is used with the plug-in unit.

6. A unit as defined in claim 1, wherein the plug-in unit, which securably accepts said injecting/ejecting unit, includes a front panel adapted to be secured adjacent and in orthogonal relationship to a front end of the plug-in unit.

7. A unit as defined in claim 6 wherein, when the plug-in unit, which securably accepts said injecting/ejecting unit, is fully inserted within the card cage, a portion of the handle portion and a portion of the ejection finger of said injecting/ejecting unit extendable through an aperture in the front panel, such that said portion of the handle portion of said injecting/ejecting unit is accessible by a user on the side of the front panel opposite that which is adjacent the plug-in unit when said unit is used with the plug-in unit.

8. An injector/ejector system used with a plug-in unit capable of fitting in a conventional card cage, said injector/ejector system comprising:

an operating means pivotally secured at a pivot location to said plug-in unit, said operating means positioned entirely on one side of said plug-in unit;

means on the operating means for ejecting said plug-in unit from said card cage;

means on the operating means for injecting said plug-in unit into said card cage wherein said injecting means is separate and discrete from said ejecting means so as to permit independent and alternating action thereof;

an ejection member secured on the card cage and presenting an ejection bearing surface in proximity to the ejecting means; and an injection member secured on the card cage at a location separated from the ejection member and presenting an injection bearing surface in proximity to the injecting means;

wherein the ejecting means is engaged with the ejection member and the injecting means is separated from the injection member when the plug-in unit is being extracted from the card cage and wherein the injecting means is engaged with the injection member and the ejecting means is separated from the ejection member when the plug-in unit is being inserted into the card cage, such that the operating means may be activated to alternatively operate the ejecting means and injecting means to facilitate the injection and ejection of the plug-in unit from the card cage.

9. An injector/ejector system as defined in claim 8, further comprising a front panel secured adjacent and in orthogonal relationship to a front end of the plug-in unit, wherein a portion of the operating means and a portion of the ejecting means each extend through an aperture in said front panel.

10. The injector/ejector system of claim 9 wherein the operating means comprises a lever, said lever having a lever extending from the pivot location outwardly through the aperture.

11. The injector/ejector system of claim 10 wherein the ejecting means comprises a first finger extension secured to the lever handle at the pivot location, said first finger extension extending outwardly from said pivot location through the aperture, wherein the ejection member comprises an ejection bearing surface on the card cage, and wherein said first finger extension engages said ejection bearing surface when the lever handle is rotated away from (the print panel) thereby ejecting (the plug-in unit) from the card cage.

12. The injector/ejector system of claim 11 wherein the injection means comprises a second finger extension secured to the lever handle at the pivot location, wherein the injection member comprises an injection bearing surface further comprising a raised ridge integral with said card cage and separated from the ejection member, and wherein said second finger extension engages said raised ridge when the lever handle is rotated toward the front panel, thereby inserting the plug-in unit into the card cage.

13. The injector/ejector system of claim 12 wherein the lever handle, the first finger extension and the second finger extension are integral with each other, defining a unitary construction, and rotating about the pivot location in a plane parallel with a face of the plug-in unit.

14. A unit for injecting and ejecting a plug-in unit within a card cage having an ejection bearing surface and an injection member separate from the ejection bearing surface, said injection member having an injection bearing surface, the injecting/ejecting unit comprising:

a handle portion adapted for operating the injecting-/ejecting unit;

a pivot portion having an upper outward portion that is integrally connected to a lower inward portion of the handle portion, said pivot portion defining a configuration permitting interconnection of the pivot portion to the plug-in unit, and permitting pivotal movement of the handle portion about said interconnection to the plug-in unit when said injecting/ejecting unit is used with the plug-in unit;

an ejection finger extending from a lower outward portion of the pivot portion and integrally connected thereto, said ejection finger defining an ejecting surface on an inward end thereof for contacting the ejection bearing surface of the card cage during extraction of the plug-in unit from the card cage; and an injection finger extending from a lower inward portion of the pivot portion that is separate from the lower outward portion of the pivot portion, and integrally connected to said lower outward portion, said injection finger defining an injecting surface on a lower end thereof for contacting the injection bearing surface of the card cage during insertion of the plug-in unit into the card cage when said injecting/ejecting unit is used with the plug-in unit;

a mounting block securable to a surface of the plug-in unit that is opposite to the surface which is adjacent the injecting/ejecting unit when said injecting-/ejecting unit is used with the plug-in unit; and a pivot pin extendable through apertures in the injecting/ejecting unit, said mounting block and the plug-in unit so as to secure said injecting/ejecting unit, said mounting block and the plug-in unit in adjacent configuration when said injecting/ejecting unit is used with the plug-in unit.

15. A unit as defined in claim 14, wherein the plug-in unit, which securably accepts said injecting/ejecting unit, includes a front panel adapted to be secured adjacent and in orthogonal relationship to a front end of the plug-in unit, said injecting/ejecting unit further comprising:

means for connecting the front panel to the mounting block to secure the front panel in the orthogonal relationship to the plug-in unit when said injecting-/ejecting unit is used with the plug-in unit.

16. A unit for injecting and ejecting a plug-in unit within a card cage having a ejection bearing surface and an injection member separate from the ejection bearing surface, said injection member having a injection bearing surface, the injecting/ejecting unit comprising:

a handle portion adapted for operating the injecting-/ejecting unit;

a pivot portion having an upper outward portion that is integrally connected to a lower inward portion of the handle portion, said pivot portion defining a configuration permitting interconnection of the pivot portion to the plug-in unit, and permitting pivotal movement of the handle portion about said interconnection to the plug-in unit when said injecting/ejecting unit is used with the plug-in unit;

an ejection finger extending from a lower outward portion of the pivot portion and integrally connected thereto, said ejection finger defining an ejecting surface on an inward end thereof for contacting the ejection bearing surface of the card cage during extraction of the plug-in unit from the card cage when said injecting/ejecting unit is used with the plug-in unit;

an injection finger extending from a lower inward portion of the pivot portion that is separate from the lower outward portion of the pivot portion, and integrally connected to said lower outward portion, said injection finger defining an injecting surface on a lower end thereof for contacting the injection bearing surface of the card cage during insertion of the plug-in unit into the card cage when said injecting/ejecting unit is used with the plug-in unit;

a mounting block securable to a surface of the pivot portion of the injecting/ejecting unit that is opposite to the surface which is adjacent the plug-in unit when said injecting/ejecting unit is used with the plug-in unit; and a pivot pin extendable through apertures in the injecting/ejecting unit, said mounting block and the plug-in unit so as to secure the injection/ejecting unit, said mounting block and the plug-in unit in adjacent configuration when said injecting/ejecting unit is used with the plug-in unit.

17. A unit as defined in claim 18, wherein the plug-in unit, which securably accepts said injecting/ejecting unit, includes a front panel adapted to be secured adjacent and in orthogonal relationship to a front end of the plug-in unit, said injecting/ejecting unit further comprising:

means for connecting the front panel to the mounting block to secure the front panel in the orthogonal relationship to the plug-in unit when said injecting/ejecting unit is used with the plug-in unit.

18. A unit as defined in claim 1, wherein the plug-in unit, which is used with said injecting/ejecting unit, is a printed circuit board.

19. A unit as defined in claim 8, wherein the plug-in unit, which is used with said injecting/ejecting unit, is a printed circuit board.

20. A unit as defined in claim 14, wherein the plug-in unit, which is used with said injecting/ejecting unit, is a printed circuit board.

21. A unit as defined in claim 16, wherein the plug-in unit, which is used with said injecting/ejecting unit, is a printed circuit board.

* * * * *